United States Patent [19]

Yasuda et al.

[11] 4,191,905
[45] Mar. 4, 1980

[54] SEALED HOUSINGS FOR A SUBMINIATURE PIEZOELECTRIC VIBRATOR

[75] Inventors: Yuh Yasuda, Higashimurayama; Sigeru Kizaki, Hanno; Yukio Miya, Tokorozawa, all of Japan

[73] Assignee: Citizen Watch Company Limited, Tokyo, Japan

[21] Appl. No.: 907,464

[22] Filed: May 19, 1978

[30] Foreign Application Priority Data

Jun. 17, 1977 [JP] Japan .................................. 52-71033
Jun. 24, 1977 [JP] Japan .................................. 52-74514
Oct. 4, 1977 [JP] Japan .................................. 52-119138
Oct. 8, 1977 [JP] Japan .................................. 52-121263

[51] Int. Cl.² ............................................. H01L 41/10
[52] U.S. Cl. ................................ 310/344; 310/348; 29/25.35
[58] Field of Search ............... 310/344, 348, 351–353, 310/312, 367, 368, 369, 300; 29/25.35

[56] References Cited

U.S. PATENT DOCUMENTS

| 1,886,792 | 11/1932 | Crossley | 310/348 X |
| 3,073,975 | 1/1963 | Bigler et al. | 310/348 X |
| 3,396,287 | 8/1968 | Horton | 310/344 X |
| 3,913,195 | 10/1975 | Beaver | 310/351 X |
| 3,931,388 | 1/1976 | Hafner et al. | 310/344 |
| 3,969,640 | 7/1976 | Staudte | 310/344 |
| 4,005,321 | 1/1977 | Shibata | 310/348 |

*Primary Examiner*—Mark O. Budd
*Attorney, Agent, or Firm*—Frank J. Jordan

[57] ABSTRACT

A housing for a subminiature piezoelectric quartz crystal vibrator element, in which a glass substrate has a recess formed in an upper surface thereof, the subminiature quartz crystal vibrator element being supported such as to be positioned within a periphery of the recess in the upper surface and separated by fixed distances from surfaces of the recess, a cover is disposed upon the glass substrate to hermetically seal the quartz crystal vibrator element between the cover and the glass substrate.

8 Claims, 14 Drawing Figures

SEALED HOUSINGS FOR A SUBMINIATURE PIEZOELECTRIC VIBRATOR

This invention relates to a housing for a subminiature piezoelectric vibrator.

Piezoelectric vibrators such as quartz crystal vibrators are in wide use in the oscillators used as a source of standard frequency signals in electronic wristwatches. In recent years, considerable progress has been made in miniaturizing such vibrators, in accordance with requirements for smaller and thinner watches, and in particular for thinner and thereby more elegant ladies wristwatches. Methods have been developed whereby a large number of quartz crystal vibrator elements can be formed almost simultaneously. Such methods utilize the photo-etching techniques which were originally developed for the manufacture of planar type semiconductor devices. Such techniques enable miniaturization of the quartz crystal vibrator element itself to be achieved. The methods of housing these quartz crystal vibrator elements, however, have several disadvantages. In one such method known in the prior art, conductive leads are attached to the quartz crystal vibrator element, which is then inserted into a metal case, generally made by a deep-drawing manufacturing process, and the case is then sealed by fusing an insulating material such as borosilicate glass in the opening of the case. This insulating material also serves to support the leads to the quartz crystal vibrator element. The disadvantages of this method are that, due to the small size of the unit, the leads are necessarily thin and fragile, and are therefore subject to fracture at the exit from the seal. In addition, various discrete components must be manipulated during the manufacturing process, which requires extremely high precision and relatively complex jigs, etc.

In another method known in the prior art, a pair of terminals is formed upon a ceramic substrate, by some method such as gold plating, etc, and the quartz crystal vibrator element is then attached to these terminals and supported thereby. The substrate has a recess situtated immediately beneath the quartz crystal vibrator element to permit the necessary amount of free space around the element. A cover of glass or metal is then sealed to the substrate, in a vacuum, by for example fusing a soft metal onto a meallized region of the substrate surface. This method has the serious disadvantage that the ceramic adsorbs chemicals during the stage of metallic deposition, so that when the assembled element is heated during the sealing of the cover, gases are released by the ceramic. The degree of vacuum inside the sealed unit is thereby reduced, causing a reduction of reliability and life expectancy.

The present invention seeks to eliminate these disadvantages of the prior art, as described above, by utilizing a glass substrate, on which terminals are formed by metallic deposition and photo-etching, by a process related to that used for mass production of semiconductor devices. An insulating layer is deposited on top of the terminals, by sputtering, evaporative deposition or the like, and then a further metallic layer is deposited on top of this insulating layer. The topmost metallic layer is then fused to a glass or metal cover, in a vacuum, by means such as interposition of a soft metal between the cover and substrate, this metal being heated to a sufficiently high temperature to melt. Since the entire housing consists of only glass and metal, the adsorption of chemicals during the stage of metallic deposition is eliminated. In addition, due to the photo-etching and deposition methods used in the manufacture of the housing, it is possible to produce a large number of housings almost simultaneously.

It is therefore an object of the present invention to provide an improved housing for a piezoelectric vibrator element.

More particularly, it is an object of the present invention to provide means whereby a large number of housings for piezoelectric vibrator elements may be manufactured almost at the same time, to enable mass production of such piezoelectric vibrators of extremely small size to be achieved.

It is a further object of the present invention to provide an improved housing for a piezoelectric vibrator element whereby the adsorption of chemicals during the manufacturing process is greatly reduced, thereby improving the stability and life duration of miniaturized piezoelectric vibrator units.

These and other objects, features and advantages of the present invention will be more apparent from the following description, when taken in conjunction with the accompanying figures, wherein.

Figure 1:
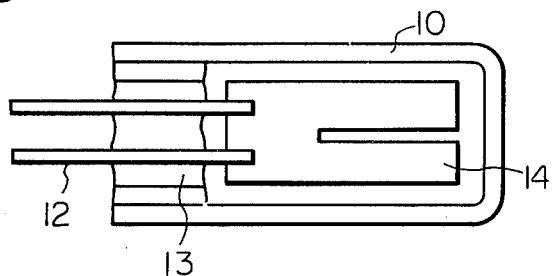
FIG. 1 illustrates a housing for a quartz crystal vibrator of a type known in the prior art, whereby the quartz crystal vibrator element is inserted into a deep-drawn metal case, and sealed therein by means such as fused glass.

Referring now to the diagrams, FIG. 1 illustrates the construction of a quartz crystal vibrator by a method known in the prior art. A tuning-fork type quartz crystal vibrator element 14 is attached to conductive leads 12, which may be formed of a cobalt alloy coated with an oxide layer. A bead of glass is moulded beforehand to have a pair of holes to receive conductive leads 12, and to fit into a case 10 which may also be fabricated of a cobalt alloy, for example. The unit is assembled by attaching conductive leads 12 to vibrator element 14. This is done by heating the entire unit with the vibrator element and glass bead inserted into case 10. The glass is fused during this heating process, which takes place in a vacuum, thereby hermetically sealing the quartz crystal vibrator element within the housing. The case 10 is usually formed by a deep-drawing manufacturing process, and a high-precision jig is used to position and insert the glass bead into case 10. Since the material of seal 13 must have a similar coefficient of expansion to the body of case 10, a borosilicate glass is frequently used. Such a housing has various disadvantages. It is difficult to manufacture extremely small cases of this type to a high degree of precision on a mass production basis, and a high degree of precision is required to position the various discrete components used, before hermetic sealing is carried out.

Figure 2:
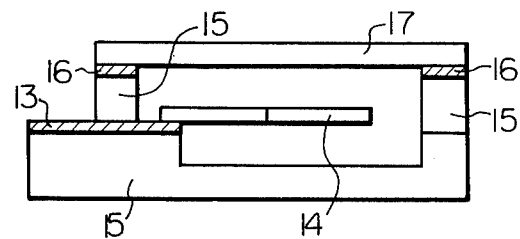
FIG. 2 is a cross-sectional view in elevation of another type of housing for quartz crystal vibrator elements known in the prior art, in which the quartz crystal vibrator element is housed within a ceramic lower substrate which is sealed by a metal or glass cover.

FIG. 2 shows another example of a quartz crystal vibrator constructed in accordance with another method known in the prior art. In this example, a pair of metallic strips 13 are deposited upon a ceramic base 15, and perform the functions of supporting a quartz crystal vibrator element 14 and providing electrical contact with thin film terminals provided upon vibrator element 14. A cover 17 is then sealed to the base 15 by means of a metallic layer 16 on ceramic 15. As for the example in FIG. 1, hermetic sealing is performed by heating the entire unit to a high temperature in a vacuum. The deposition of metallic layers 13 and 16 usually involves a plating process. Since ceramic is porous, chemicals are adsorbed during the plating process, and as a result, when the housing is sealed at high temperature, gases such as cyanogen are released from the ceramic. These gases cause a reduction of the vacuum within the housing, and also can cause corrosion of the thin film electrodes on the quartz crystal vibrator element 14.

Figure 3:
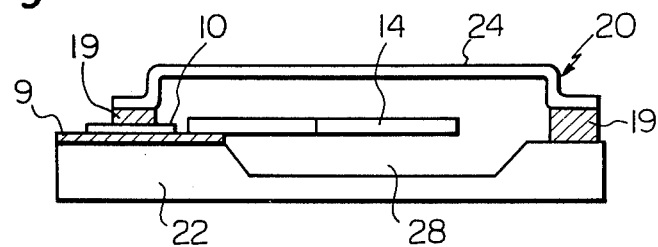
FIG. 3 is a cross-sectional view in elevation of a first embodiment of a housing for a quartz crystal vibrator element in accordance with the present invention.

FIG. 3 illustrates a preferred embodiment of a quartz crystal vibrator in accordance with the present invention, which utilizes a tuning fork type of quartz crystal vibrator element. A recess, the sides of which are arranged at an obtuse angle with respect to its lower surface, is formed in a glass substrate 22. The slope of the sides of the recess facilitates the manufacture of the substrate, the recess being formed by molding, photo-etching, or other means. A pair of conductive metal strips 9, are deposited upon substrate 22, to provide electrical connection to a pair of thin film terminals upon quartz crystal vibrator element 14, and to provide a means of supporting vibrator element 14. An insulating layer 10, consisting of a material such as SiOx, is deposited on top of conductive metal strips 9 so as to partially cover these. Deposition of layer 10 can be performed by vacuum depostion, sputtering, or other means. A metallic layer 19 is then formed on top of said insulating layer and substrate 22, to form a continuous ring of metallization which completely surrounds quartz crystal vibrator element 14. The housing cover 24 is then sealed to metallic layer 19. Sealing can be performed by interposing a layer of fusible metal between the cover 24 and metallized layer 19, then heating the entire unit to a high temperature in a vacuum, the cover being fabricated from metal or glass. With this embodiment, since the material of the housing consists only of metal and glass, the adsorption of chemicals during the formation of metallic layers is almost completely eliminated, and so the generation of gases within the housing during the high-temperature sealing process is also eliminated. Greater reliability is therefore obtained for the quartz crystal vibrator units. In addition, the conducting metal strips 9, insulating layer 10, and metallic layer 19 can all be formed by deposition and photo-etching processes which are well known in the field of semiconductor manufacture. Thus, the method of this embodiment of the present invention is much more suitable for the large scale manufacture of quartz crystal vibrators of extremely small size than the methods known in the prior art and described above. If insulating layer 10 is made extremely thin, capacitative coupling between conducting metal strips q via metallic layer 19 may present problems. The thickness of insulating layer 10 will therefore be determined by the operating frequency of the quartz crystal vibrator, the width of the conductive metal strips, etc.

Figure 4:
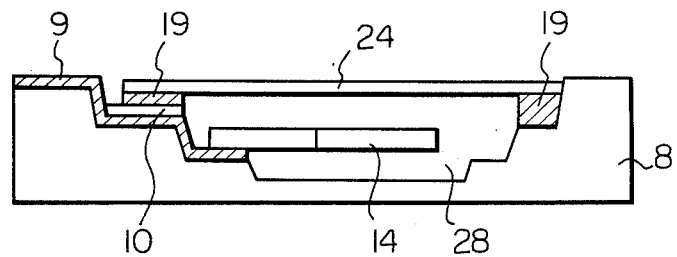
FIG. 4 is a cross-sectional view in elevation of a modified form of a housing shown in FIG. 3 for a quartz crystal vibrator element in accordance with the present invention, whereby the top surface of the housing can be made completely flat.

FIG. 4 illustrates a modified form of a quartz crystal vibrator in accordance with the present invention. In this modification, the sides of recess 28 consist of three steps, the sides of which are arranged at an obtuse angle with respect to the lower surface of the recess. With this arrangement, the top surface of cover 24 can be made co-planar with the top surface of substrate 22, so that a completely flat-topped housing can be produced. This can facilitate the positioning of the quartz crystal vibrator within a very slim shape of wristwatch. In this embodiment, the pair of conductive metal strips 9 which serve to provide contact with the vibrator element 14 are deposited along both the sloping and flat surfaces of one side of recess 28. Insulating layer 10 and metallic layer 19 perform the same functions as described for the embodiment shown in FIG. 3 above.

Figure 5:
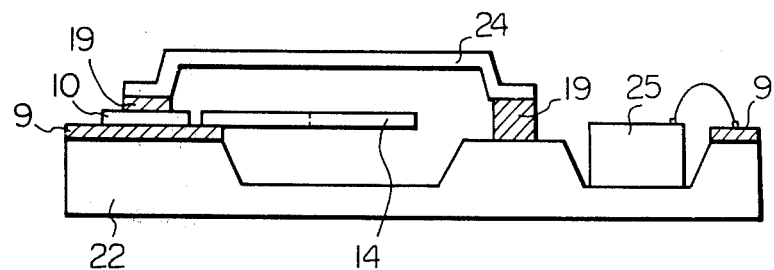
FIG. 5 is a cross-sectional view in elevation of another modification of a housing shown in FIG. 3 for a quartz crystal vibrator element in accordance with the present invention, whereby additional components may be mounted upon the same substrate as the vibrator element.

FIG. 5 illustrates another modification of a quartz crystal vibrator in accordance with the present invention. This modification is similar to the first embodiment shown in FIG. 3 above. With the arrangement shown in FIG. 5, the glass substrate 22 is extended and a further recess is provided to accomodate one or more components which are associated with the operation of the quartz crystal vibrator, and must be electrically connected thereto. This component is indicated by numeral 25. Conducting strips 9, which provide contact with electroded formed upon quartz crystal vibrator element 14, are extended to points adjacent to component 25, so that connection to component 25 can easily be performed. As a result, the number of external connections associated with the quartz crystal vibrator unit can be significantly reduced. The cost of assembling an electronic wristwatch can be reduced by this embodiment, and reliability increased.

Figure 6:
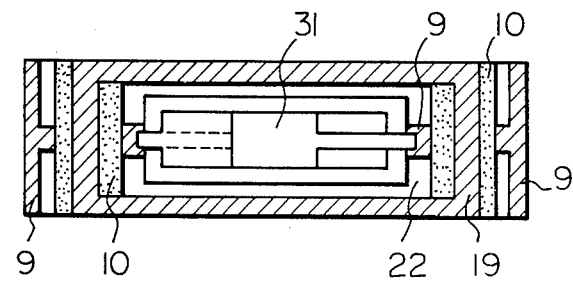
FIG. 6 is a plan view of a substrate for another modification of a housing for a quartz crystal vibrator in accordance with the present invention, whereby the capacitance between the leads to the quartz crystal vibrator element is greatly reduced, this embodiment being suited for used with high frequency vibrator elements.

The embodiment shown in FIG. 6 is designed to reduce electrical coupling between the conducting metallic strips 9, which connect to terminals formed upon the quartz crystal vibrator element. This is done by arranging each of strips 9 at opposite ends of the glass substrate 22. This embodiment is therefore highly suited for quartz crystal vibrators which operate at high frequencies, and utilize an AT type of quartz crystal element, for example. As in the previous embodiments described above, a recess is formed in a glass substrate 22, upon which metallic conductive strips 9 are deposited, and insulating layers 10 are then deposited on top of strips 9 to partially cover them. A metallic layer 10, which forms a continuous ring, is then formed on top of insulating layers 10 and substrate 22, providing means for sealing a metal or glass cover to the substrate.

Figure 7:
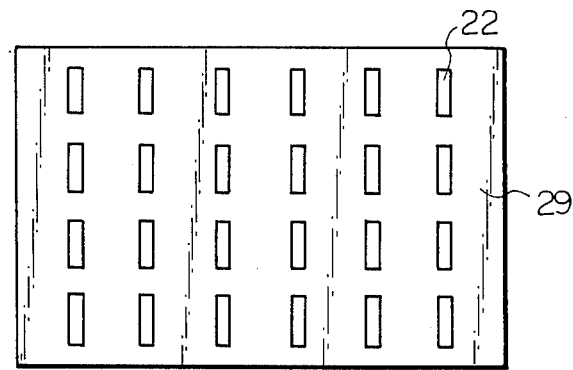
FIG. 7 is a plan view of a glass sheet upon which a large number of substrates with metallic and insulating layers deposited thereon, can be manufactured almost simulatenously.

FIG. 7 illustrates how a large number of substrates for quartz crystal vibrator housings in accordance with the present invention can be formed upon a single plate of glass, 29. A number of substrates 22, as shown in FIGS. 3 through 6 can be formed by successive deposition and photo-etching stages, with each of these stages being performed simultaneously for all of the substrates upon the glass plate 29. This illustrates how the quartz crystal vibrator housings in accordance with the present invention are particularly well suited to mass production manufacture.

Figure 8:
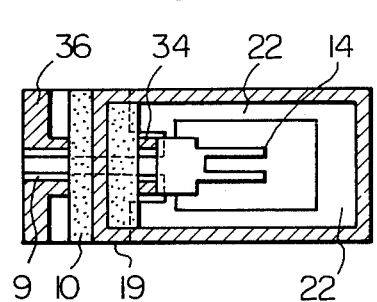
FIG. 8 is a plan view of a second embodiment of a housing in accordance with the present invention.
Figure 9:
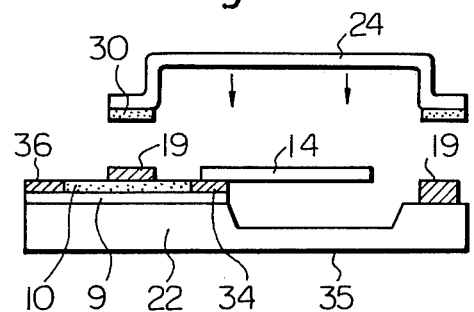
FIG. 9 is a cross-sectional view in elevation of the embodiment of FIG. 8.

Referring now to FIG. 8, a plan view is shown therein of the lower portion of a fifth embodiment of a quartz crystal vibrator in accordance with the present invention. FIG. 9 is an elevation in cross-section of the same embodiment. As for the embodiments shown in FIGS. 3 through 6, a recess having sloping sides is formed in a glass substrate, 22, upon which a pair of conductive metallic strips 9 are deposited, and an insulating layer 10 is then deposited on top of a portion of the said conductive metallic strips. However, in this fifth embodiment, metallic connecting layers 36 and 34 are formed on top of the areas of conductive metallic strips 9 which are not covered by insulating layer 10. Metallic connecting layers 34 serve to establish electrical contact between conducting metalic strips 9 and the vibrator element terminals, and to support the vibrator element. Metallic layers 36 serve as terminals for the connection of external leads to the quartz crystal vibrator. A further metallic layer 19, which forms a continuous ring around the recess in substrate 22, serves as means for sealing a cover 24, by for example fusing a layer of soft metal 30 in a vacuum. All of metallic layers 9, 36, 34 and 19 can be formed by a photo-etching process. As described above with reference to FIG. 7, such forming of layers can be performed simultaneously for a number of quartz crystal vibrator housings upon a single plate of glass.

Figure 10:
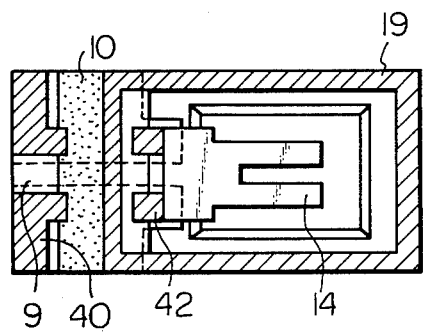
FIG. 10 is a plan view of a third embodiment of a quartz crystal vibrator housing in accordance with the present invention, aimed at overcoming certain disadvantages of the embodiment of FIGS. 8 and 9.
Figure 11:
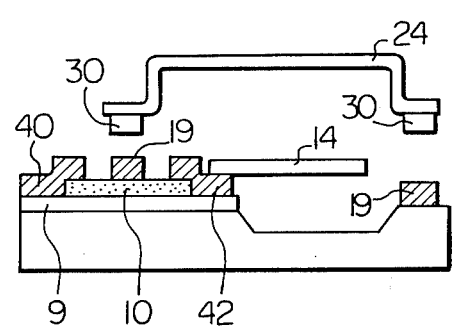
FIG. 11 is a cross-sectional view in elevation of the embodiment of FIG. 10.

FIG. 10 shows a plan view of the lower portion of another embodiment of a quartz crystal vibrator in accordance with the present invention. FIG. 11 shows a cross-sectional view in elevation of the same embodiment. This embodiment is designed to improve upon the fifth embodiment of the present invention, described with reference to FIGS. 8 to 9. During the etching process in which metallic layers 34 and 36 shown in FIGS. 8 and 9 are formed, by etching a continuous layer of metal, it is possible that if the masks used for the photo-etching process are not precisely aligned, a portion of conducting metallic strips 9 may become exposed to the etchant. This can be caused by the etchant infiltrating through between the insulating layer 10 and metallic layers 34 or 36. As a result, an open-circuit condition may develop in the connection between connecting layers 36 and the terminals of quartz crystal vibrator element 14. With the embodiment shown in FIGS. 10 and 11, this danger is eliminated. This is accomplished by forming layers 42 which support and connect to the vibrator element 14, and connecting layers 40, which serve as external terminals, so that these connecting layers partially overlap insulating layer 10. As in the previous embodiments, a continuous metallic layer 19 in the shape of a square ring, serves as a means for sealing cover 24 to the lower portion of the housing. After conducting metallic strips 9 have been formed, and insulating layer 10 has been deposited, a continuous metal layer is deposited upon the entire upper surface of the lower portion of the housing, and metallic layers 40, 42 and 19 can then be formed by photo-etching. With the method of this embodiment, even if the mask used in the photo-etching process whereby layers 40, 19 and 42 are formed should be slightly displaced during the etching process, the partial overlapping of layers 40 and 42 upon insulating layer 10 serves to ensure that no etchant can penetrate to the conducting metallic strips 9. As in the embodiments described previously, a layer of soft metal 30 can be fused at high temperature in a vacuum to provide a hermetic seal. It will be apparent that this embodiment of the present invention enables a quartz crystal vibrator of high reliability to be produced, with decreased requirements for accuracy during the photo-etching process used to form metallic layers within the housing. This method is therefore particularly suitable for large-scale mass production of miniaturized quartz crystal vibrators.

Figure 12:
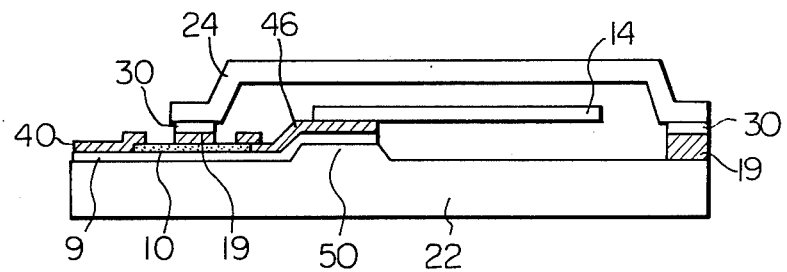
FIG. 12 is a cross-sectional view in elevation of a fourth embodiment of a quartz crystal vibrator housing in accordance with the present invention, whereby free space between the substrate and the quartz crystal vibrator element is provided by mounting the vibrator element upon a pedestal on the substrate.
Figure 13:
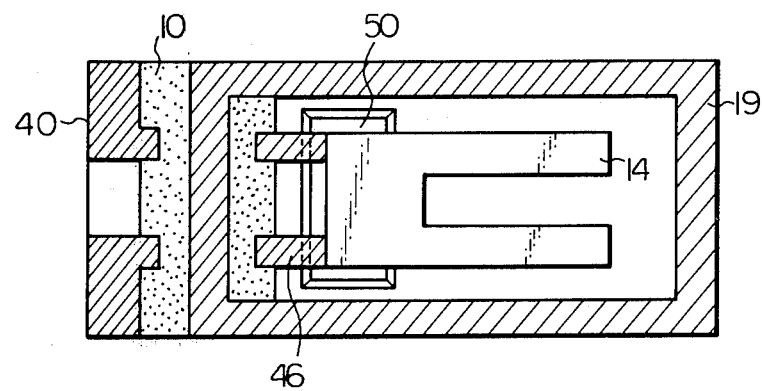
FIG. 13 is a plan view of a substrate in accordance with the embodiment of FIG. 12, with the quartz crystal vibrator element mounted.

Referring now to FIGS. 12 and 13, another embodiment is shown therein of a quartz crystal vibrator in accordance with the present invention. A projecting pedestal 50 is formed upon a glass substrate 22, by etching, molding, or other means. A pair of conducting metallic strips 9 are formed upon glass substrate 22, being extended across the top surface of pedestal 50 from one side of the substrate. An insulating layer 10 is then formed, by sputtering, vacuum deposition or other means, on top of strips 9. Metallic connecting layers 40 and 46 are then formed on top of the portions of conducting metallic strips 9 which are not covered by insulating layer 10, and partially overlapping insulating layer 10 as shown. Metallic layers 46 serve to support quartz crystal vibrator element 14 and provide electrical contact with the terminals thereof, while metallic layers 40 serve as terminals for external connection to the quartz crystal vibrator. Metallic layer 19 forms a continuous ring around quartz crystal vibrator element 14, and serves for hermetically sealing a cover 24, to the lower portion of the housing, by means such as fusing an interposed layer of soft metal 30 in a vacuum. Since quartz crystal vibrator element 14 is raised above the surface of substrate 22 by pedestal 50, the required degree of free space is left between the vibrator element and substrate 22.

Figure 14:
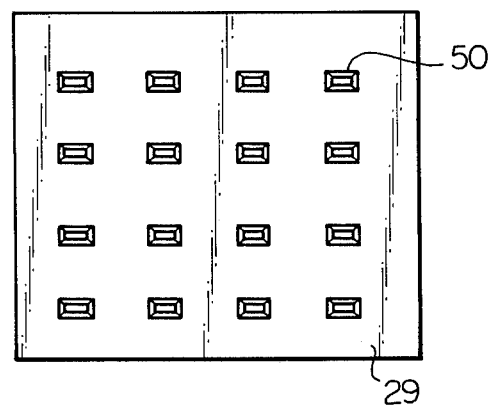
FIG. 14 is a plan view of a glass sheet upon which a large number of the substrates in accordance with the embodiment of FIGS. 12 and 13 may be formed simultaneously.

FIG. 14 illustrates how a large number of pedestals 50 can be formed simultaneously upon a single glass plate 29. Since metallic strips 9, metallic layers 43 and 46, and cover connection layer 19 can be formed by processes which are performed simultaneously for all of the substrates upon glass plate 29, mass production of quartz crystal vibrator element housings is practicable.

While the present invention has been shown and described with reference to the particular embodiments by way of examples, it should be noted that various other changes or modifications may be made without departing from the scope of the present invention.

What is claimed is:

1. A subminiature piezoelectric quartz crystal vibrator comprising:
   a glass substrate having a recess formed in an upper surface thereof;
   a pair of conductive metal layers formed on the upper surface of said glass substrate;
   a quartz crystal vibrator element supported on upper surfaces of said pair of conductive layers such that the vibrator element is positioned within a periphery of said recess in said upper surface and separated by fixed distances from surfaces of said recess;
   an insulating layer formed upon and partially covering said pair of conductive layers and areas of said upper surface of said glass substrate adjacent to said pair of conductive layer;
   a first connecting metallic layer formed upon and partially convering said insulating layer and said upper surface of said glass substrate to form a continuous ring of metallization which surrounds said quartz crystal vibrator element; and
   a housing cover sealed to said glass substrate by means of said first connecting metallic layer.

2. A subminiature piezoelectric quartc crystal vibrator according to claim 1, wherein saides of said recess form at least one step with respect to said upper surface of said glass substrate.

3. A subminiature piezoelectric quartz crystal vibrator according to claim 2, wherein the plane of at least one side of said recess forms an obtuse angle with respect to the plane of a lower surface of said recess.

4. A subminiature piezoelectric quartz crystal vibrator according to claim 1, wherein the thickness of said insulating layer is greater than that of said conductive layers.

5. A subminiature piezoelectric quartz crystal vibrator according to claim 1, further comprising second connecting metallic layers formed upon portions of said conductive layers not covered by said insulating layer and which are adjacent to said recess, and third metallic connecting layers formed upon portions of said conductive layers not covered by said insulating layer and which are adjacent to an outer periphery of said upper surface of said glass substrate.

6. A subminiature quartz crystal vibrator according to claim 5, in which said second metallic connecting layers and said third metallic connecting layers partially cover said insulating layer.

7. A subminiature piezoelectric quartz crystal vibrator according to claim 1, in which said glass substrate also has another recess to receive at least one component electrically connectable to said conductive layers.

8. A subminiature piezoelectric quartz crystal vibrator comprising:
   a glass substrate having an upper surface thereof, a first step formed at a periphery of said recess, a second step formed at a periphery of said first step, and a third step formed at a periphery of said second step, said third step having a thickness larger than that of said second step which is larger in thickness than said first step;
   a pair of conductive metal layers formed on upper surfaces of said first, second and third steps of said glass substrate;
   a quartz crystal vibrator element supported on upper surfaces of said pair of conductive layers on said first step such that the vibrator element is positioned within a periphery of said recess and separated by fixed distances from surfaces of said recess;
   an insulating layer formed upon and partially covering said pair of conductive layers and areas of said second step of said glass substrate adjacent to said pair of conductive layers;
   a connecting metallic layer formed upon and partially covering said insulating layer and an upper surface of said second step of said glass substrate to form a continuous ring of metallization on said second step which surrounds said quartz crystal vibrator element; and
   a housing cover placed on and secured to said connecting metallic layer to hermetically seal said vibrator element between said housing cover and said glass substrate such that a top surface of said housing cover is substantially co-planar with a top surface of said third step.

* * * * *